(12) United States Patent
Cho et al.

(10) Patent No.: US 8,796,090 B2
(45) Date of Patent: Aug. 5, 2014

(54) SEMICONDUCTOR DEVICE WITH VERTICAL CHANNEL TRANSISTOR AND METHOD FOR FABRICATING THE SAME

(71) Applicant: SK hynix Inc., Gyeonggi-do (KR)

(72) Inventors: Heung-Jae Cho, Gyeonggi-do (KR); Tae-Yoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/716,931

(22) Filed: Dec. 17, 2012

(65) Prior Publication Data

US 2014/0011334 A1    Jan. 9, 2014

(30) Foreign Application Priority Data

Jul. 4, 2012    (KR) .......................... 10-2012-0072782

(51) Int. Cl.
*H01L 21/8242*    (2006.01)

(52) U.S. Cl.
USPC ............ 438/253; 438/269; 438/680; 438/424

(58) Field of Classification Search
CPC .................. H01L 29/66666; H01L 27/10885; H01L 27/10876; H01L 27/1052; H01L 21/8239

USPC ................................... 438/253, 269, 680, 424
See application file for complete search history.

(56) References Cited

U.S. PATENT DOCUMENTS

| | | | |
|---|---|---|---|
| 2003/0068885 A1 * | 4/2003 | Cheong | 438/674 |
| 2004/0173858 A1 | 9/2004 | Beintner et al. | |
| 2006/0017088 A1 * | 1/2006 | Abbott et al. | 257/302 |
| 2007/0026651 A1 | 2/2007 | Leam et al. | |
| 2010/0015776 A1 * | 1/2010 | Chen et al. | 438/424 |
| 2010/0237405 A1 * | 9/2010 | Shin | 257/329 |
| 2010/0308466 A1 | 12/2010 | Takesako | |
| 2011/0045670 A1 * | 2/2011 | Kim et al. | 438/653 |
| 2012/0146221 A1 * | 6/2012 | Shim | 257/741 |
| 2013/0189840 A1 * | 7/2013 | Fu et al. | 438/680 |

* cited by examiner

*Primary Examiner* — Jarrett Stark
*Assistant Examiner* — Mohammad M Hoque
(74) *Attorney, Agent, or Firm* — IP & T Group LLP

(57) ABSTRACT

A method for fabricating a semiconductor device includes forming a plurality of semiconductor body lines in which a plurality of buried bit lines are buried, to be separated by a plurality of trenches, forming a filling layer that fills each of the plurality of trenches, forming a conductive layer over the plurality of semiconductor body lines and the filling layer, forming a plurality of semiconductor pillars over the plurality of semiconductor body lines by etching the conductive layer.

16 Claims, 15 Drawing Sheets

SEMICONDUCTOR DEVICE WITH VERTICAL CHANNEL TRANSISTOR AND METHOD FOR FABRICATING THE SAME

CROSS-REFERENCE TO RELATED APPLICATIONS

The present application claims priority of Korean Patent Application No. 10-2012-0072782, filed on Jul. 4, 2012, which is incorporated herein by reference in its entirety.

BACKGROUND

1. Field

Exemplary embodiments of the present invention relate to a semiconductor device, and more particularly, to a semiconductor device with vertical channel transistors and a method for fabricating the same.

2. Description of the Related Art

Most semiconductor devices include transistors. For example, in a memory device such as a DRAM, a memory cell includes a cell transistor such as a MOSFET. In general, in a MOSFET, source and drain regions are formed in a semiconductor substrate, and a planar channel is formed between the source region and the drain region. Such a MOSFET is generally referred to as a 'planar channel transistor'.

As the degree of integration and performance continue to improve, a MOSFET fabrication technology has reached a physical limit. For instance, as the size of a memory cell decreases, the size of a MOSFET decreases, and accordingly, the channel length of the MOSFET also decreased. If the channel length of a MOSFET decreases, the characteristics of a memory device are likely to deteriorate as various concerns caused in that data retention characteristics deteriorate.

In consideration of these problems, a vertical channel transistor has been suggested. The vertical channel transistor (VCT) includes a pillar to serve as a vertical channel. A source region and a drain region are formed in top and bottom portions of the pillar. The pillar serves as a channel, and a vertical gate electrode is formed on a sidewall of the pillar. The source region and the drain region are connected with a bit line.

FIG. 1 is a cross-sectional view illustrating a conventional buried bit lines.

Referring to FIG. 1, a plurality of semiconductor body lines 14 are formed on a semiconductor substrate 11 to be separated by trenches 13. The semiconductor body lines 14 are formed through etching using a hard mask layer 12. A passivation layer 15 is formed on the sidewalls of the semiconductor body lines 14 and the surfaces of the trenches 13. Open parts 17 are formed in the passivation layer 15. The open parts 17 open any one sidewall of the semiconductor body lines 14. Buried bit lines 16 partially fill the trenches 13. The buried bit lines 16 connect with the semiconductor body lines 14 through the open parts 17. Each buried bit line 16 connects with any one of two adjacent semiconductor body lines 14. While not shown, upper portions of the semiconductor body lines 14 are etched, and semiconductor pillars, which serve as channels of vertical channel transistors, are formed.

As shown in FIG. 1, in order to connect each buried bit line 16 to the sidewall of any one of two adjacent semiconductor body lines 14, an OSC (one-side-contact) process is applied. In order to accomplish the OSC process, various methods such as a liner layer and tilt ion implantation process, an OSC mask process, and the like have been proposed.

However, these methods fail to form a uniform and reproducible OSC structure due to difficulties in processing. Also, as high integration further proceeds, a concern is caused in that the distance between adjacent buried bit lines 16 becomes narrow and parasitic capacitance ($C_B$) between adjacent buried bit, lines 16 increases. Since the buried bit lines 16 are brought into contact with the semiconductor body lines 14, the parasitic capacitance ($C_B$) between buried bit lines 16 is substantially the capacitance between the semiconductor body line 14 and the buried bit line 16. Accordingly, because the distance between adjacent buried bit lines 16 becomes narrow, the parasitic capacitance ($C_B$) may increase dramatically.

If the parasitic capacitance ($C_B$) between buried bit lines increases in this way, the operation of a device may become inoperable.

Furthermore, in the conventional art, in consideration of the height of semiconductor pillars to serve as channels, high aspect ratio etching is required as an etching process for forming the semiconductor body lines 14. Therefore, since the trenches 13 are formed to have depth of H to include the height of the semiconductor pillars, a concern is raised in that the semiconductor body lines 14 are likely to lean.

SUMMARY

Exemplary embodiments of the present invention are directed to a semiconductor device that may reduce parasitic capacitance between adjacent buried bit lines, and a method for fabricating the same.

Other exemplary embodiments of the present invention are directed to a semiconductor device that may prevent leaning of a semiconductor body line due to a high aspect ratio etching process, and a method for fabricating the same.

In accordance with an embodiment of the present invention, a method for fabricating a semiconductor device may include forming a plurality of semiconductor body lines in which a plurality of buried bit lines are buried, to be separated by a plurality of trenches, forming a filling layer that fills each of the plurality of trenches, forming a conductive layer over the plurality of semiconductor body lines and the filling layer, and forming a plurality of semiconductor pillars over the plurality of semiconductor body lines by etching the conductive layer.

In accordance with another embodiment of the present invention, a method for fabricating a semiconductor device may include etching a silicon substrate and forming a plurality of silicon body lines that are separated by a plurality of trenches, forming a dielectric layer in the trenches to have a height lower than a height of the plurality of silicon body lines, forming a filling silicon layer over the dielectric layer through a thermal process that allows silicon migration, forming a silicon layer over the filling silicon layer and the plurality of silicon body lines, and forming a plurality of silicon pillars over the plurality of silicon body lines by etching the silicon layer and the filling silicon layer, wherein the plurality of silicon pillars include channel regions of vertical channel transistors.

DETAILED DESCRIPTION

Figure 1:
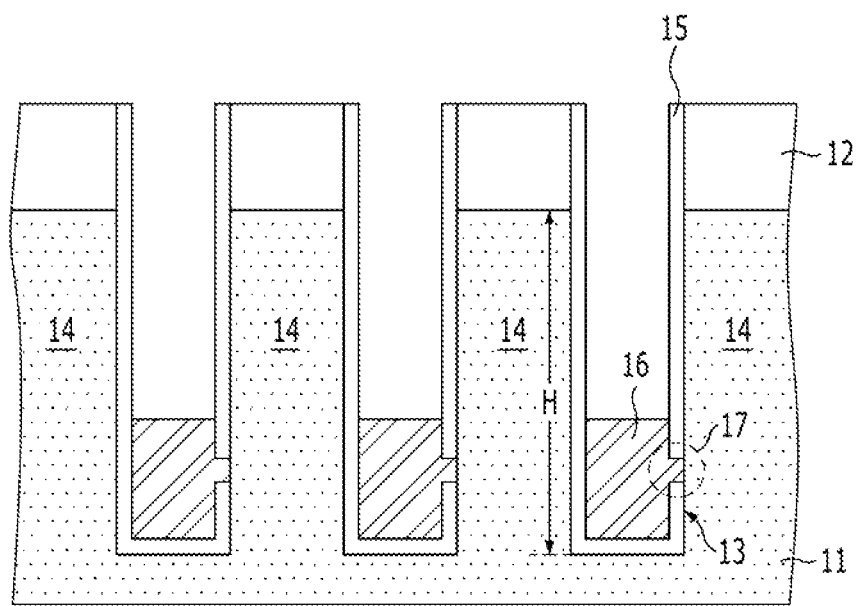
FIG. 1 is a cross-sectional view illustrating a conventional buried bit lines.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

Figure 2A:
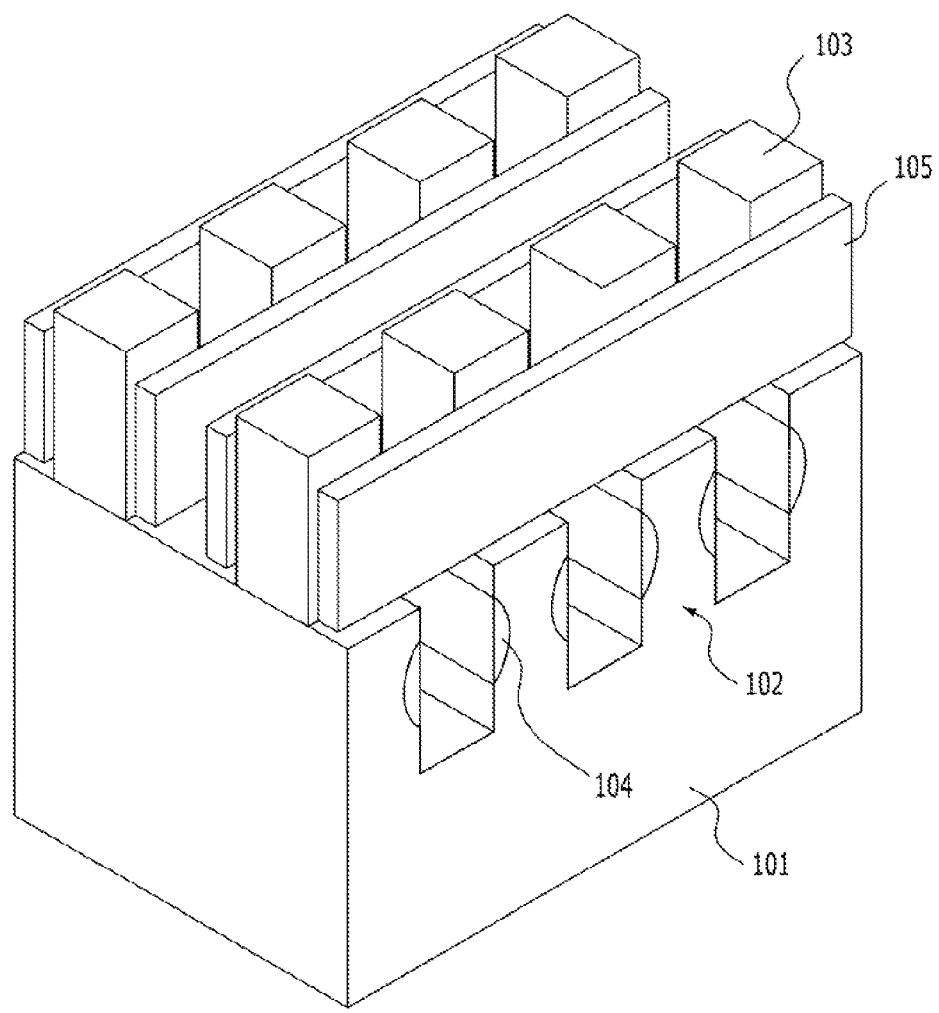
FIG. 2A is a perspective view illustrating a semiconductor device with buried bit lines in accordance with a first embodiment of the present invention.
Figure 2B:
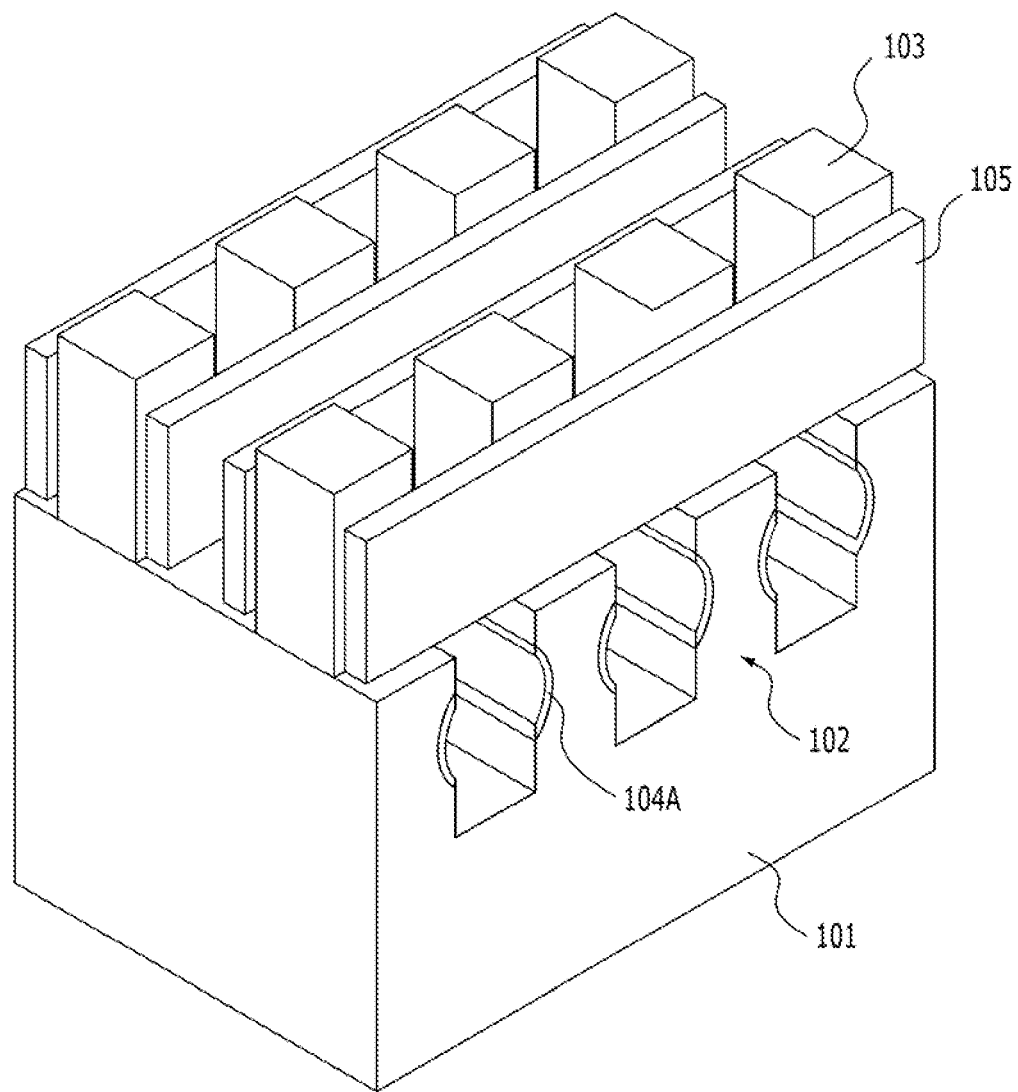
FIG. 2B is a perspective view illustrating a semiconductor device with buried bit lines accordance with a second embodiment of the present invention.
Figure 2C:
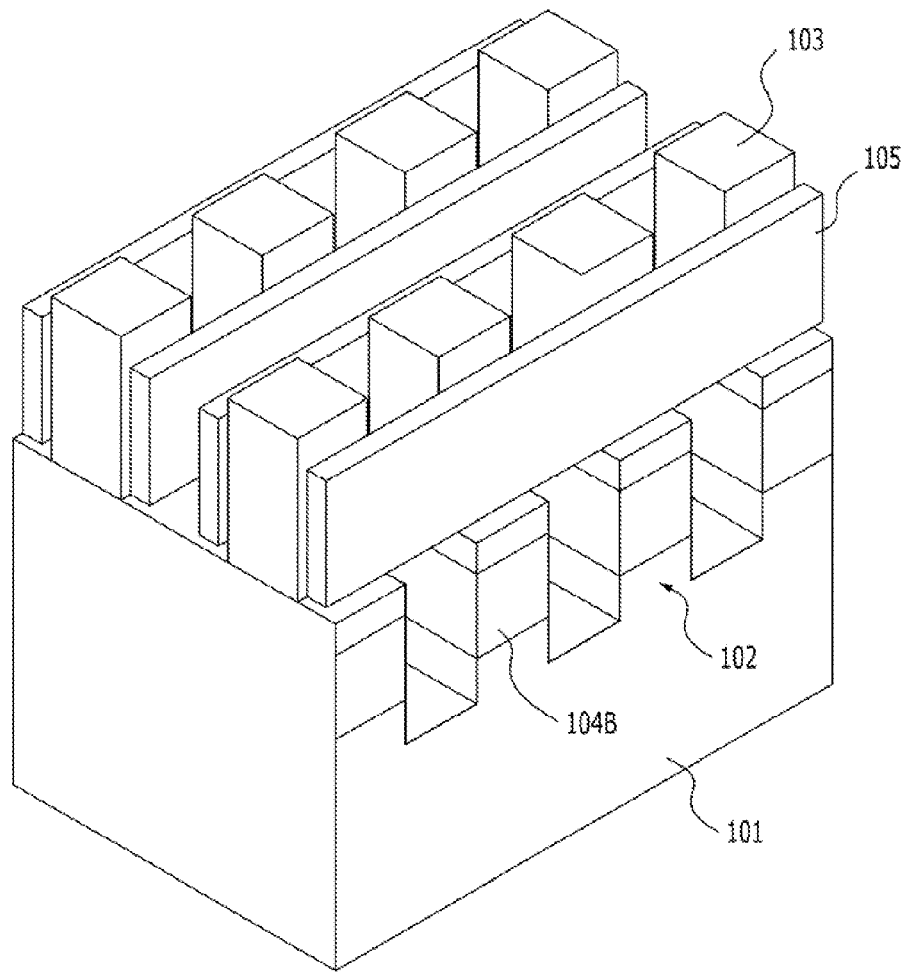
FIG. 2C is a perspective view illustrating a semiconductor device with buried bit lines in accordance with a third embodiment of the present invention.

FIG. 2A is a perspective view illustrating a semiconductor device with buried bit lines in accordance with a first embodiment of the present invention. FIG. 2B is a perspective view illustrating a semiconductor device with buried bit lines in accordance with a second embodiment of the present invention. FIG. 2C is a perspective view illustrating a semiconductor device with buried bit lines in accordance with a third embodiment of the present invention.

Referring to FIG. 2A, a semiconductor device includes buried bit lines 104, semiconductor pillars 103, and word lines 105. A plurality of semiconductor body lines 102 and a plurality of semiconductor pillars 103 are formed on a semiconductor substrate 101. A plurality of semiconductor pillars 103 are formed on each semiconductor body line 102. That is to say, a plurality of semiconductor pillars 103 may be formed on one semiconductor body line 102. The plurality of semiconductor body lines 102 are formed on the semiconductor substrate 101. The semiconductor body lines 102 are vertically formed on the semiconductor substrate 101. The semiconductor pillars 103 may be formed to vertically extend on the semiconductor body lines 102. For example, the semiconductor body lines 102 and the semiconductor pillars 103 may be perpendicular to each other. The plurality of semiconductor pillars 103 are separately disposed on the semiconductor body lines 102, and they may have a matrix type array.

The semiconductor substrate 101 may include a substance that include silicon. For example, the semiconductor substrate 101 may include a monocrystalline silicon substrate. The semiconductor body lines 102, the semiconductor pillars 103 and the semiconductor substrate 101 may include the same substance. Accordingly, the semiconductor body lines 102 and the semiconductor pillars 103 may also include a silicon-containing substance. For example, the semiconductor body lines 102 and the semiconductor pillars 103 may include monocrystalline silicon. The semiconductor pillars 103 may be formed by etching a silicon layer that is formed through epitaxial growth on the semiconductor body lines 102.

The semiconductor pillars 103 may include the channel regions of vertical channel transistors. Also, the semiconductor pillars 103 may have a structure in which the source/drain regions and the channel regions of vertical channel transistors are formed. For example, the semiconductor pillars 103 may include source regions, drain regions and channel regions. Any region of the source regions and the drain regions may be connected with the buried bit lines 104. The other regions may be connected with capacitors. The source regions, the channel regions and the drain regions may be connected in a vertical direction. The source regions, the channel regions and the drain regions may form NPN junctions or PNP junctions. For example, in the case where the source regions and the drain regions are doped with impurities of a first conductivity type, the channel regions may be doped with impurities of a second conductivity type that is opposite to the first conductivity type. For example, in the case where the impurities of the first conductivity type are N type impurities, the impurities of the second conductivity type include P type impurities. On the contrary, in the case where the impurities of the first conductivity type are P type impurities, the impurities of the second conductivity type include N type impurities. In the case where the vertical channel transistors are NMOSFETs, the source regions, the channel regions and the drain regions may form NPN junctions.

The semiconductor body lines 102 and the semiconductor pillars 103 may be formed through different processes. As will be described later, a process for forming the semiconductor body lines 102 and a process for forming the semiconductor pillars 103 are separately discussed.

The semiconductor body lines 102 are vertically formed on the semiconductor substrate 101. The semiconductor body lines 102 may extend in a first direction. The buried bit lines 104 and the semiconductor body lines 102 may extend together in the first direction. The semiconductor body lines 102 may have recessed sidewalls. The semiconductor body lines 102 may include a substance that contains silicon. In an exemplary embodiment, the semiconductor body lines 102 may include monocrystalline silicon.

The buried bit lines 104 are buried in the semiconductor body lines 102. Adjacent buried bit lines 104 may be isolated by a dielectric layer (not shown). The buried bit lines 104 may be buried in the recessed sidewalls of the semiconductor body lines 102. The buried bit lines 104 may extend in the first direction. The buried bit lines 104 may include a metallic substance. In an exemplary embodiment, the buried bit lines 104 may include a metal or a metal silicide. By doing so, the buried bit lines 104 may have low resistance.

The word lines 105 are vertically formed on the sidewalls of the semiconductor pillars 103. Thus, the word lines 105 are referred to as vertical word lines. The word lines 105 may be formed on both sidewalls of the semiconductor pillars 103 to have a double word line structure. Even in the double word line structure, the ends of the respective word lines may be connected. Since the semiconductor pillars 103 serve as regions where the channels of vertical channel transistors are formed, vertical channels are formed by the word lines 105. Therefore, vertical channel transistors including the word lines, the source regions, the channel regions and the drain regions are formed. The word lines 105 may extend in a second direction that is perpendicular to the first direction, which is the direction that the buried bit lines 104 are extended. The word lines 105 may include a metallic substance. In an exemplary embodiment, the word lines 105 may include a titanium nitride (TIN), the stack of a tungsten nitride (WN) and tungsten (W), or the like. To this end, a dielectric layer (not shown) may be additionally formed between the word lines 105 and the buried bit lines 104. The dielectric layer may include a silicon oxide. In another embodiment, the word lines 105 may extend in the second direction that is perpendicular to the first direction, while surrounding the sidewalls of the semiconductor pillars 103. Furthermore, after forming gate electrodes to surround the sidewalls of the semiconductor pillars 103, word lines 105 may be connected with the gate electrodes.

FIG. 2B shows buried bit lines 104A which are formed with a substantially uniform thickness, so that they do not fill the recessed sidewalls of the semiconductor body lines 102. The buried bit lines 104A may include a metal or a metal silicide.

FIG. 2C shows a structure in which buried bit lines 104B are positioned in the semiconductor body lines 102, which are disposed below the semiconductor pillars 103. The buried bit lines 104B of FIG. 2C may be formed through a full silicidation process. Accordingly, the buried bit lines 104B may include a metal silicide such as a cobalt silicide.

According to the above-described embodiments, the buried bit in lines 104, 104A and 104B are buried in the semiconductor body lines 102. Therefore, because adjacent buried bit lines 104, 104A and 104B are sufficiently separated, parasitic capacitance ($C_B$) between adjacent buried bit lines 104, 104A and 104B may be reduced. Furthermore, vertical structures, where the buried bit lines 104, 104A and 104B are disposed, are positioned below the semiconductor pillars 103. Because of this, it is not necessary to form the buried bit lines 104, 104A and 104B between the semiconductor pillars 103, and thus, high degree of integration is made possible.

FIGS. 3A to 3J are cross-sectional views illustrating an exemplary method of forming the buried bit lines of the semiconductor device in accordance with the first embodiment of the present invention.

Figure 3A:
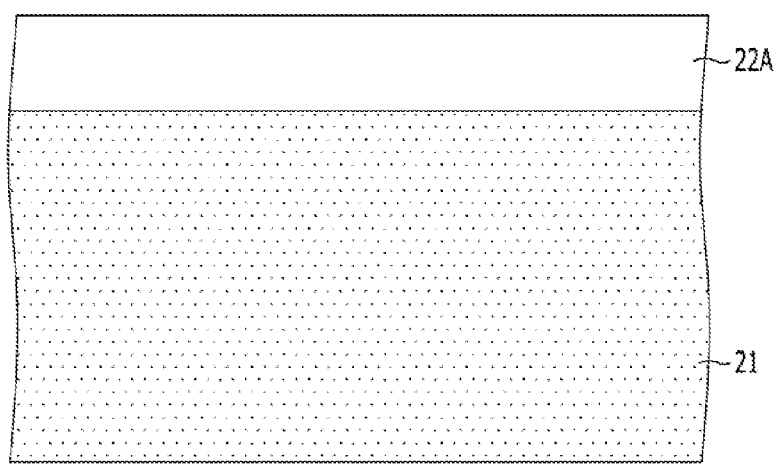
FIGS. 3A to 3J are cross-sectional views illustrating an exemplary method of forming the buried bit lines of the semiconductor device in accordance with the first embodiment of the present invention.

Referring to FIG. 3A, a first hard mask layer 22A is formed on a semiconductor substrate 21. The semiconductor substrate 21 may include a monocrystalline substance. The semiconductor substrate 21 may include a substance that contains silicon. For example, the semiconductor substrate 21 may include monocrystalline silicon. The first hard mask layer 22A includes a silicon nitride. The first hard mask layer 22A may have a multi-layered structure that may include a silicon oxide and a silicon nitride. For example, the first hard mask layer 22A may have a stacked structure in order of a silicon nitride and a silicon oxide. Also, the first hard mask layer 22A may be stacked in order of a silicon nitride, a silicon oxide, a silicon oxynitride and an amorphous carbon. In the case where the first hard mask layer 22A includes a silicon nitride, a pad oxide layer (not shown) may be additionally formed between the semiconductor substrate 21 and the first hard mask layer 22A.

Figure 3B:
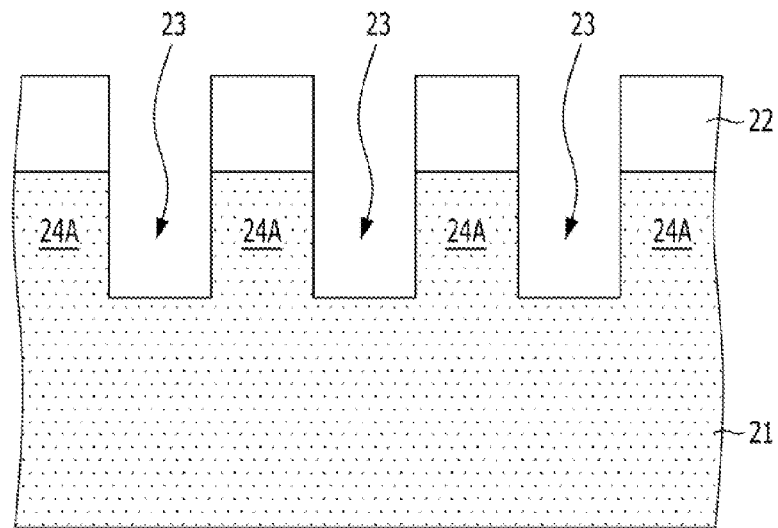

Referring to FIG. 3B, first hard mask layer patterns 22 are formed by etching the first hard mask layer 22A. The first hard mask layer patterns 22 are formed by using photoresist patterns, which are not illustrated. The first hard mask layer patterns 22 are formed to extend in the first direction. The first hard mask layer patterns 22 may include line patterns that extend in the first direction.

A trench etching process is performed by using the first hard mask layer patterns 22 as an etch mask. For example, a plurality of preliminary trenches 23 are defined by etching the semiconductor substrate 21 by a predetermined depth by using the first hard mask layer patterns 22 as an etch barrier. A plurality of preliminary semiconductor body lines 24A are formed on the semiconductor substrate 21. The plurality of preliminary semiconductor body lines 24A are separated by the plurality of preliminary trenches 23. More specifically, the respective preliminary semiconductor body lines 24A are separated from one another by the preliminary trenches 23. The preliminary semiconductor body lines 24A have two sidewalls. The trench etching process may include anisotropic etching. In the case where the semiconductor substrate 21 is a silicon substrate, the preliminary semiconductor body lines 24A become preliminary silicon body lines. The plurality of preliminary semiconductor body lines 24A are separated from one another by the preliminary trenches 23 and the preliminary semiconductor body lines 24A are formed perpendicular to the surface of the semiconductor substrate 21. The preliminary semiconductor body lines 24A have both sidewalls which laterally face away from each other. When viewed on the top, the preliminary semiconductor body lines 24A are separated by the preliminary trenches 23. Moreover, the preliminary semiconductor body lines 24A are formed in the direction perpendicular to the surface of the semiconductor substrate 21, and have linear structures that extend in the first direction.

As described above, the preliminary semiconductor body lines 24A are formed in the perpendicular direction with respect to the surface of the semiconductor substrate 21. The first hard mask layer patterns 22 are formed on the preliminary semiconductor body lines 24A. The plurality of preliminary semiconductor body lines 24A are separated from one another by the preliminary trenches 23. The preliminary trenches 23 are defined shallowly, because the height of semiconductor pillars may not be considered. In other words, the depth of the preliminary trenches 23 is shallower than the depth H of the trenches 13 shown in FIG. 1. Hence, it is possible to prevent leaning of the preliminary semiconductor body lines 24A.

Figure 3C:
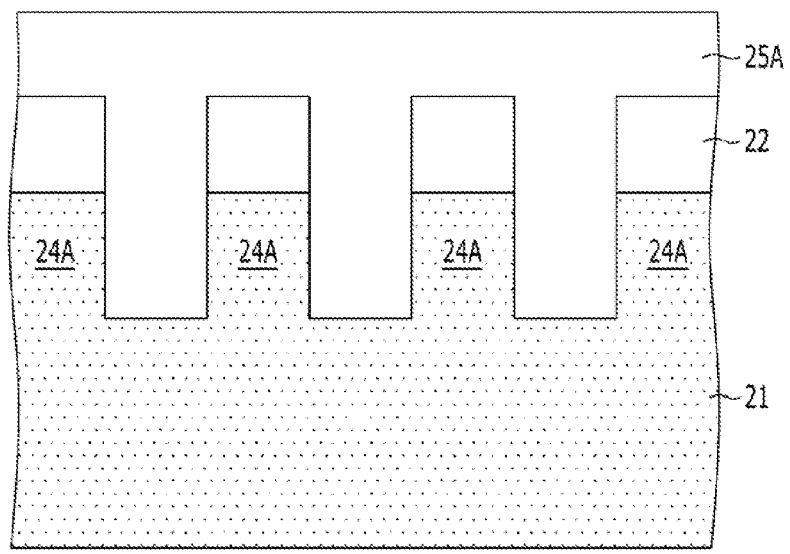

Referring to FIG. 3C, a sacrificial layer 25A is formed on the entire surface to fill the preliminary trenches 23. The sacrificial layer 25A may include a dielectric layer. For example, the sacrificial layer 25A may include a silicon oxide.

Figure 3D:
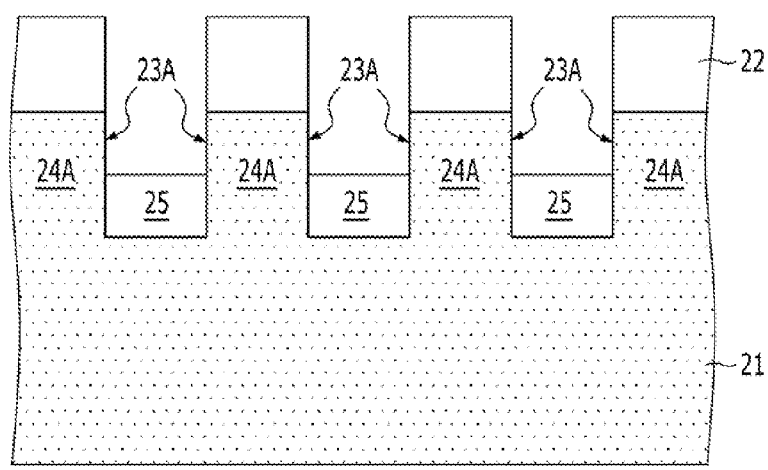

Referring to FIG. 3D, sacrificial layer patterns 25 are formed to partially fill the preliminary trenches 23. The sacrificial layer patterns 25 are partially filled to expose upper sidewalls 23A of the preliminary trenches 23. In order to form the sacrificial layer patterns 25 to partially fill the preliminary trenches 23, the sacrificial layer 25A may be etched selectively and recessed. In order to form the partially sacrificial layer patterns 25 that partially fills the preliminary trenches 23, an etch-back process may be adopted.

Figure 3E:
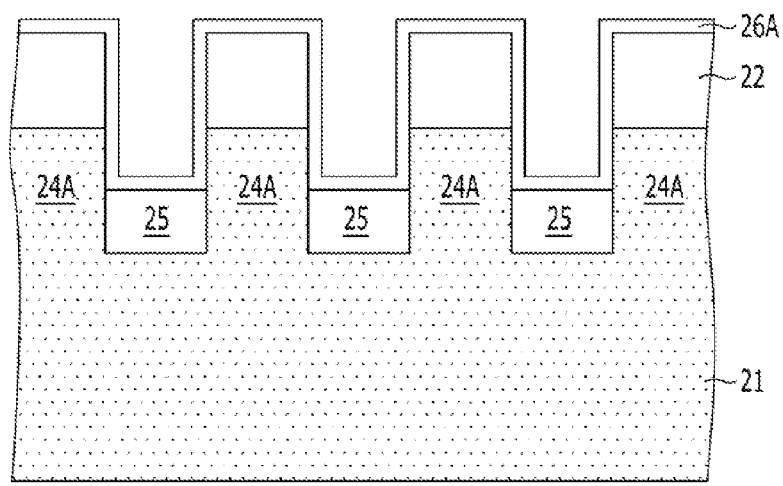

Referring to FIG. 3E, a dielectric layer 26A is formed on the entire surface including the sacrificial layer patterns 25. The dielectric layer 26A may include a nitride such as a silicon nitride. The dielectric layer 26A may be formed with a substantially uniform thickness.

Figure 3F:
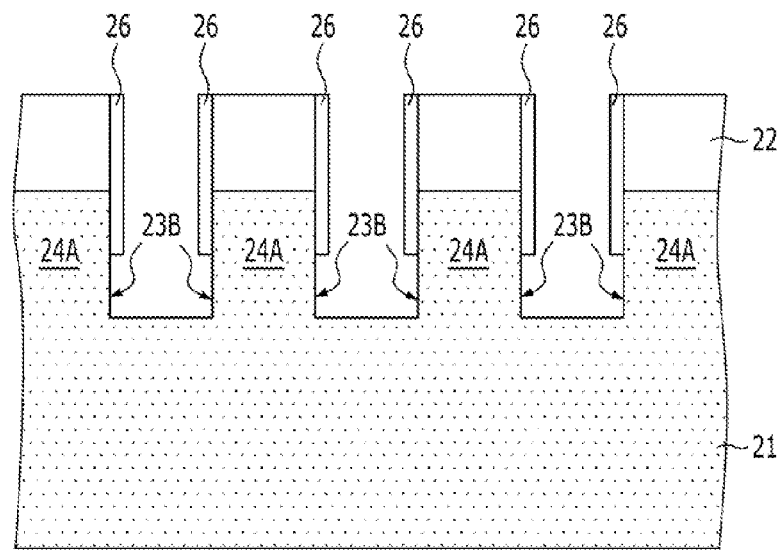

Referring to FIG. 3F, spacers 26 are formed by selectively etching the dielectric layer 26A. The spacers 26 are formed through spacer etching. Spacer etching may include an etch-back process. The spacers 26 cover the upper sidewalls 23A (shown in FIG. 3D) of the preliminary trenches 23 and both sidewalls of the first hard mask layer patterns 22.

The sacrificial layer patterns 25 are removed by using the spacers 26 as a barrier. By doing so, the preliminary trenches 23 are exposed. In another embodiment, the sacrificial layer patterns 25 in may be partially left to protect the lower portions of the preliminary trenches 23. By removing the sacrificial layer patterns 25, lower sidewalls 23B of the preliminary trenches 23 are exposed. The spacers 26 remain on the upper sidewalls 23A of the preliminary trenches 23.

Figure 3G:
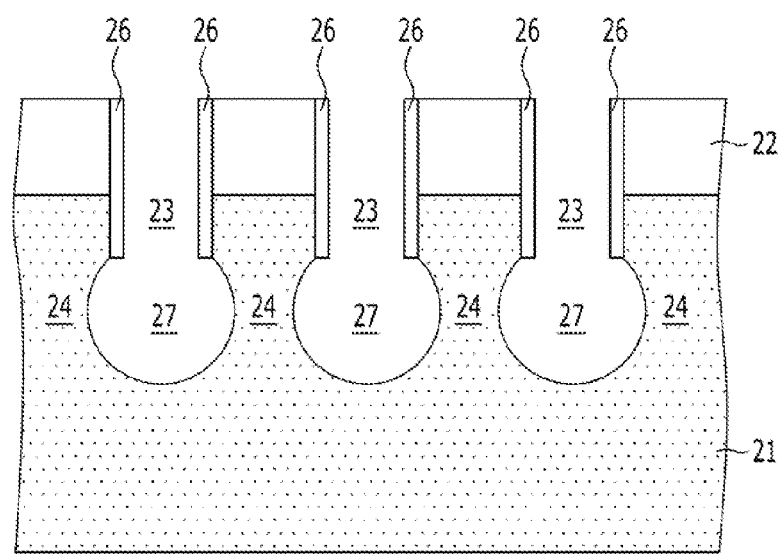

Referring to FIG. 3G, isotropic etching is performed by using the spacers 26 as a barrier. Accordingly, the lower side ails 23B and the bottoms of the preliminary trenches 23 are etched, and bulbs 27 are formed. The preliminary trenches 23 and the bulbs 27 form bulb-type trench structures. As the bottom surfaces and the lower sidewalls 23B of the preliminary trenches 23 are isotropically etched through isotropic etching, the curve-shaped bulbs 27 are formed. When performing the isotropic etching, an etch amount in a direction toward sidewalls under the preliminary semiconductor body lines 24A may be controlled from approximately 1 nm to approximately 20 nm. By forming the bulbs 27, the height of the preliminary semiconductor body lines 24A increases. As a result, semiconductor body lines 24 are formed.

By forming the bulbs 27 as described above, a plurality of semiconductor body lines 24 are separated from one another by bulb-shaped trenches that include the preliminary trenches 23 and the bulbs 27. Since the depth of the preliminary trenches 23 and the bulbs 27 is relatively shallow, the exemplary embodiment may prevent semiconductor body lines 24 from leaning.

Since the semiconductor substrate 21 and the preliminary semiconductor body lines 24A include a substance that contains silicon, the semiconductor body lines 24 become silicon bodies. The plurality of semiconductor body lines 24 are separated from one another by the bulb-shaped trenches that include the preliminary trenches 23 and the bulbs 27, and the semiconductor body lines 24 are formed in the direction perpendicular to the surface of the semiconductor substrate 21. The semiconductor body lines 24 have both sidewalls, which laterally face away from each other. When viewed on the top, the semiconductor body lines 24 are separated by the bulb-shaped trenches and extend in the first direction. The lower sidewalls of the semiconductor body lines 24 are recessed by the bulbs 27. Namely, the semiconductor body lines 24 have recessed sidewalls. The first hard mask layer patterns 22 remain on the semiconductor body lines 24. The spacers 26 remain on the upper sidewalls of the semiconductor body lines 24.

Figure 3H:
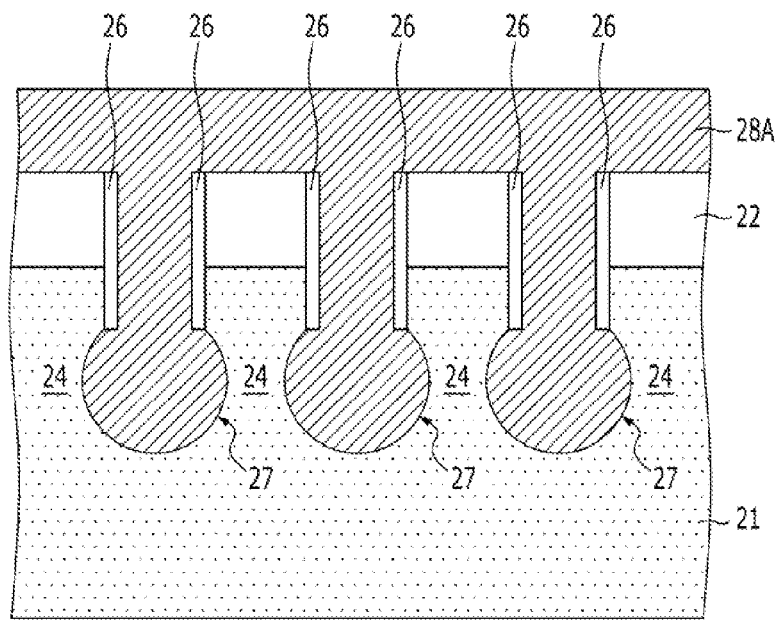

Referring to FIG. 3H, a first conductive layer 28A is formed on the entire surface to fill the bulb-shaped trenches. The first conductive layer 28A may be formed by using a low resistance substance. For example, the first conductive layer 28A may include a metal, a metal nitride, a silicide, or a combination thereof. In another embodiment, the first conductive layer 28A may not be formed to fill the bulbs 27 but may be formed with a substantially uniform thickness that is given. In the case where the first conductive layer 28A is formed with the substantially uniform thickness, the buried bit lines 104A shown in FIG. 2B may be formed. In the case where the buried bit lines 104A include a metal silicide, the metal silicide may be formed on the sidewalls of the bulbs 27 by annealing after depositing a metal layer. After forming the metal silicide, the unreacted metal layer may be removed. The buried bit lines 104B shown in FIG. 2C may be obtained by using a full silicidation process when forming the metal silicide.

Figure 3I:
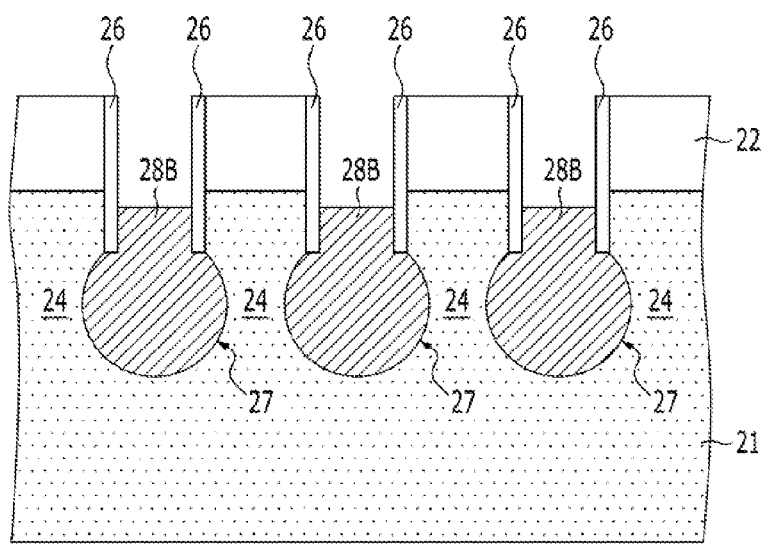

Referring to FIG. 3I, by selectively etching the first conductive layer 28A, preliminary bit lines 28B which at least fill the bulbs 27 are formed. The height of the preliminary bit lines 28B may be lower than the first hard mask layer patterns 22. In another embodiment, the height of the preliminary bit lines 28B may be controlled to fill the bulbs 27.

Figure 3J:
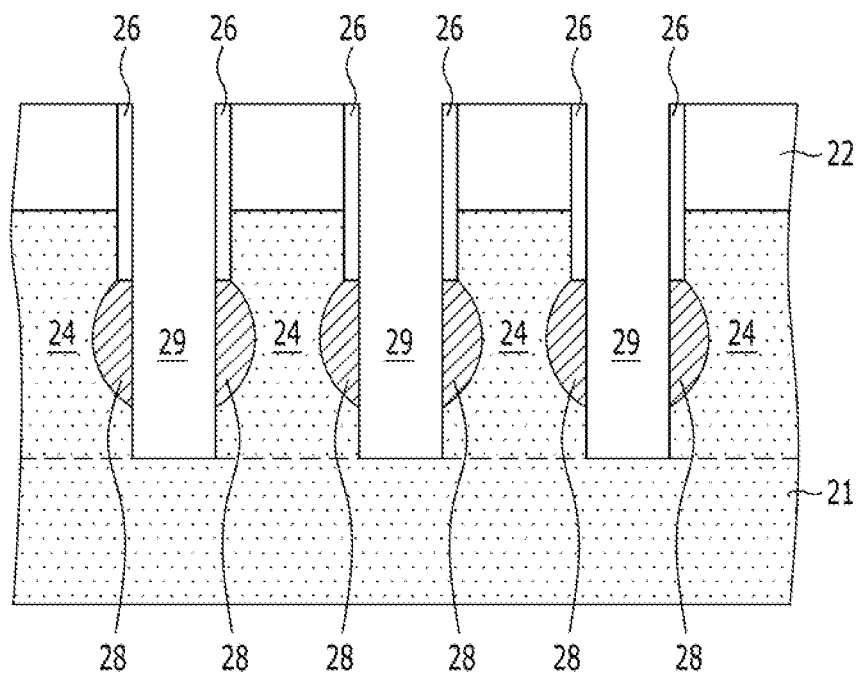

Referring to FIG. 3J, buried bit lines 28 are formed. For example, by performing etching to divide the preliminary bit lines 28B, buried bit lines 28 that are separated from one another are formed. To form the buried bit lines 28, the preliminary bit lines 28B may be etched through etch-back. The buried bit lines 28 may be separated from one another by first trenches 29. The buried bit lines 28 are buried in the lower sidewalls of the semiconductor body lines 24. The lower sidewalls are the sidewalls of the bulbs 27, and the buried bit lines 28 are buried in the sidewalls of the bulbs 27. Accordingly, the sidewalls of the bulbs 27, where the buried bit lines 28 are buried, provide recessed sidewalls as both sidewalls of the semiconductor body lines 24, and the buried bit lines 28 are buried in the recessed sidewalls.

Through such a series of processes, the buried bit lines 28 that are buried in the recessed sidewalls of the semiconductor body lines 24 are formed. The first hard mask layer patterns 22 may remain on the semiconductor body lines 24. The spacers 26 may remain on the upper sidewalls of the semiconductor body lines 24. The semiconductor body lines 24 are perpendicularly formed on the semiconductor substrate 21 and are separated from one another by the first trenches 29. The semiconductor body lines 24 may extend in the same direction as the buried bit lines 28. The semiconductor body lines 24 may have linear structures.

Vertical channel transistors including semiconductor pillars may be formed on the semiconductor body lines 24. In the present embodiment, the semiconductor pillars are formed not by etching the upper portions of the semiconductor body lines 24 but by forming a conductive layer and performing an etching process. The formation of the semiconductor pillars will be described in detail below.

FIGS. 4A to 4F are cross-sectional views illustrating an exemplary method of forming the semiconductor pillars of the semiconductor device in accordance with the first embodiment of the present invention.

Figure 4A:
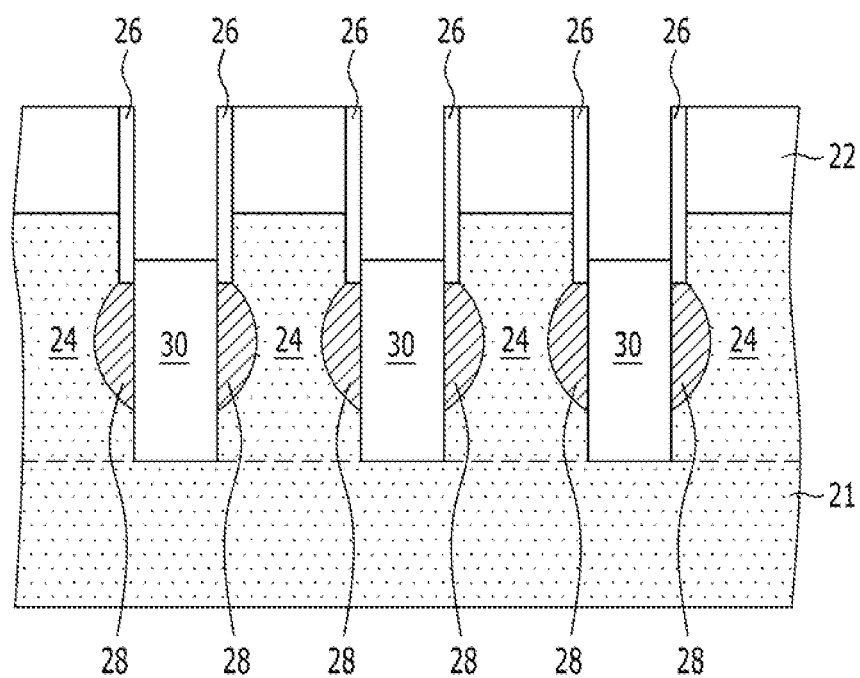
FIGS. 4A to 4F are cross-sectional views illustrating an exemplary method of forming the semiconductor pillars of the semiconductor device in accordance with the first embodiment of the present invention.

Referring to FIG. 4A, a first interlayer dielectric layer 30 is formed to partially fill the first trenches 29, which is shown in FIG. 3J. The first interlayer dielectric layer 30 may include an oxide such as a silicon oxide. In order for the first interlayer dielectric layer 30 to partially fill the first trenches 29, the first interlayer dielectric layer 30 may be formed on the entire surface to fill the first trenches 29 and may then be recessed. The first interlayer dielectric layer 30 may be recessed to cover exposed portions of the buried bit lines 28. In this way, adjacent buried bit lines 28 are isolated from each other by the first interlayer dielectric layer 30. In other words, the first interlayer dielectric layer 30 isolates adjacent buried bit lines 28. Since the first interlayer dielectric layer 30 fills the first trenches 29, linear pillar structures may be formed. That is to say, the first interlayer dielectric layer 30 may be dielectric layer pillars.

Figure 4B:
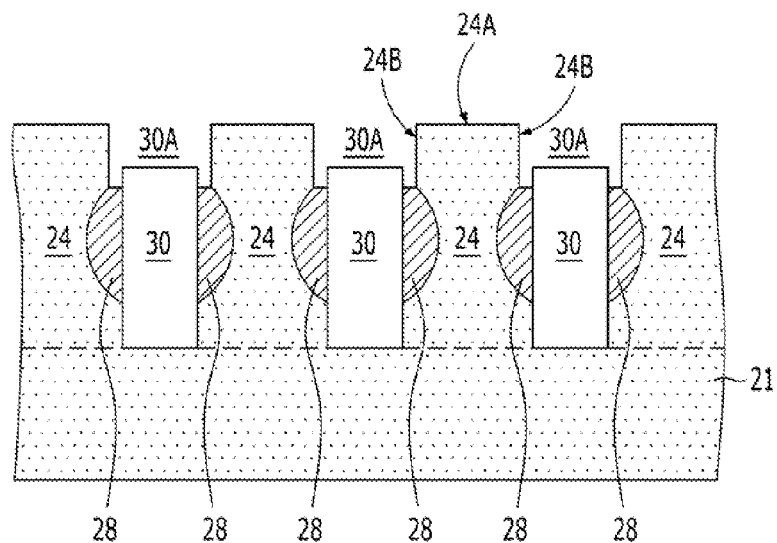

Referring to FIG. 4B, the first hard mask layer patterns 22 and the spacers 26 are removed. As the first hard mask layer patterns 22 and the spacers 26 are removed, the surfaces of the semiconductor body lines 24, which are illustrated in FIG. 4A, are exposed. The exposed surfaces of the semiconductor body lines 24 include upper surfaces 24A and sidewall surfaces 24B. The sidewall surfaces 24B include the surfaces that are exposed by the first interlayer dielectric layer 30. Step portions are formed between the upper surfaces 24A and the first interlayer dielectric layer 30, and the upper surface of the first interlayer dielectric layer 30 is positioned lower than the upper surfaces 24A of the semiconductor body lines 24. Accordingly, recesses 30A are defined in a self-aligned manner between adjacent semiconductor body lines 24.

Figure 4C:
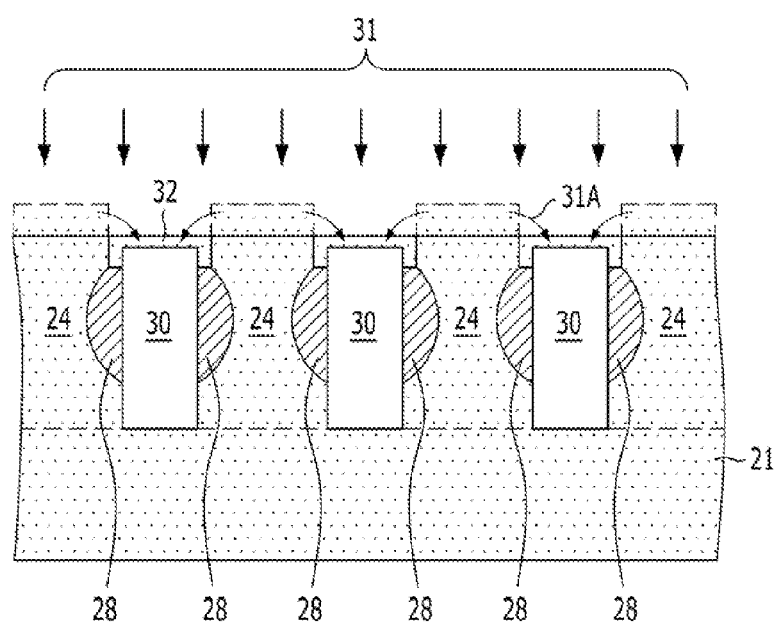

Referring to FIG. 4C, a filling layer 32 is formed to fill the recesses 30A. In order to form the filling layer 32, a thermal process 31 may be performed. As the upper portions of the semiconductor body lines 24 are affected by the thermal process 31, the recesses 30A may be filled with the filling layer 32. For example, by performing the thermal process 31, migration of atoms 31A may be induced from the upper surfaces of the semiconductor body lines 24. Because the semiconductor body lines 24 include monocrystalline silicon, silicon migration may be induced by the thermal process 31. The silicon migration is described in detail. The thermal process 31 is performed at a high temperature under a hydrogen ($H_2$) atmosphere. In order to effectively induce the migration of atoms 31A, a step for removing foreign substances may be necessary before the thermal process 31. For example, a wet etching process and a hydrogen ($H_2$) bake process may be performed. Moreover, when performing the thermal process 31, an atmosphere may be produced by using only hydrogen ($H_2$) or the mixture of hydrogen ($H_2$) and an inert gas at a processing temperature between approximately 700° C. and approximately 1200° C. The silicon migration is promoted by reduction reaction of hydrogen, and the recesses 30A may be sufficiently filled by the silicon migration. In another example, silicon migration may be induced without forming the first interlayer dielectric layer 30. In this case, the buried bit lines 28 may not be protected from the thermal process 31. Therefore, after thinly lining amorphous silicon, a thermal process may be performed. However, because phase change into polysilicon and growth of amorphous silicon is caused during silicon migration, various defects may result.

By performing the thermal process 31 as described above to induce the migration of atoms 31A, the recesses 30A defined on the first interlayer dielectric layer 30 may be filled by the filling layer 32. As the surfaces of the semiconductor body lines 24 are lowered and planarized due to the migration of atoms 31A, the filling layer 32 is formed. Because the semiconductor body lines 24 include monocrystalline silicon, the filling layer 32 may also include a buried silicon layer. For example, the filling layer 32 may include a monocrystalline silicon layer.

The buried bit lines 28 and the first interlayer dielectric layer 30 are buried by the filling layer 32. The first interlayer dielectric layer 30 is disposed between adjacent buried bit lines 28. The buried bit lines 28 buried by the filling layer 32 so that the buried bit lines 28 do not have any exposure or opening.

As a result, in the present embodiment, because the thermal process 31 is performed when the first interlayer dielectric layer 30 and the semiconductor body lines 24 are exposed, a high-quality filling layer 32 may be formed without any defect. Since the filling layer 32 includes monocrystalline silicon, a high-quality monocrystalline silicon filling layer may be formed. Accordingly, it is possible to grow monocrystalline silicon without a defect in a subsequent epitaxial growth process.

The semiconductor body lines 24 and the filling layer 32 define planarized upper surfaces. The surfaces of the semiconductor body lines 24 and the filling layer 32 may have the same kind of atoms.

Figure 4D:
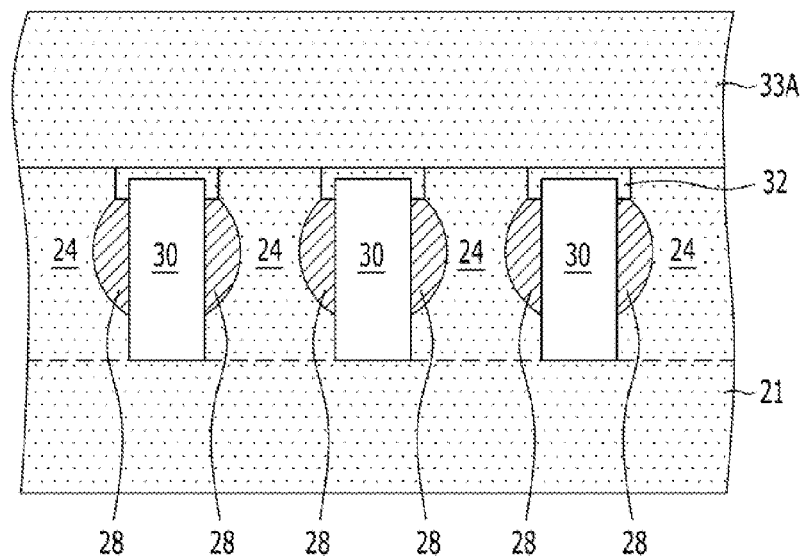

Referring to FIG. 4D, a second conductive layer 33A is formed on the semiconductor body lines 24 and the filling layer 32. The second conductive layer 33A may include a substance that contains silicon, such as a silicon layer. The second conductive layer 33A may be formed through epitaxial growth. In the epitaxial growth process, the semiconductor body lines 24 and the filling layer 32 are used as seeds. The second conductive layer 33A may include a silicon layer, which is formed through epitaxial growth. Since the semiconductor body lines 24 and the filling layer 32 include monocrystalline silicon, the second conductive layer 33A may include a monocrystalline silicon layer by epitaxial growth. More specifically, because the bottom surface before forming the second conductive layer 33A includes the semiconductor body lines 24 and the filling layer 32, which are formed of a monocrystalline silicon substance, it is possible to grow the second conductive layer 33A without a defect.

Doping of impurities may be performed when growing the second conductive layer 33A. For example, impurities may be doped in situ at the same time with the growth of the second conductive layer 33A, and NPN junctions (or PNP junctions) may be formed. Also, after an undoped silicon layer that is not doped with impurities is grown as the second conductive layer 33A, NPN junctions may be formed through subsequent ion implantation. The NPN junctions include a structure in which an N type impurity region, a P type impurity region, and an N type impurity region are vertically formed. In the NPN junctions, the P type impurity region becomes a channel, and the N type impurity regions become source/drain regions. As the second conductive layer 33A formed with the NPN junctions are subsequently etched, semiconductor pillars are formed. The semiconductor pillars may include the source regions, the channel regions and the drain regions of vertical channel transistors.

Figure 4E:
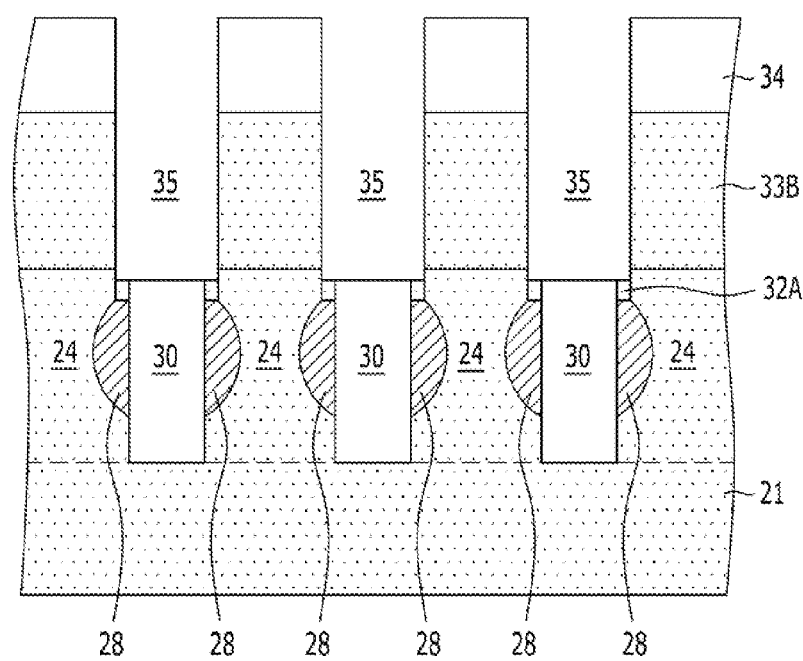

Referring to FIG. 4E, second hard mask layer patterns 34 are formed on the second conductive layer 33A, which is illustrated in FIG. 4D.

The second conductive layer 33A is etched by using the second hard mask layer patterns 34 as an etch mask. Accordingly, second trenches 35 are defined, and a plurality of preliminary semiconductor pillars 338 are separated by the second trenches 35. The first interlayer dielectric layer 30 is exposed through the second trenches 35. The width of the second trenches 35 may be equal to that of the preliminary trenches 23 as shown in FIG. 3B. The preliminary semiconductor pillars 33B may include silicon pillars. The preliminary semiconductor pillars 338 may include monocrystalline silicon pillars. When forming the preliminary semiconductor pillars 33B, the filling layer 32 may be etched. The filling layer 32 may be entirely removed or may be partially etched. In the case where the filling layer 32 is partially etched, the filling layer 32 may partially remain as indicated by the reference numeral 32A.

As described above, the preliminary semiconductor pillars 338 are formed on the semiconductor body lines 24. The preliminary semiconductor pillars 336 may extend in a direction parallel to the buried bit lines 28. The preliminary semiconductor pillars 33B may be perpendicularly formed over the buried bit lines 28. The preliminary semiconductor pillars 336 may have linear structures, which are perpendicularly formed on the semiconductor body lines 24.

Figure 4F:
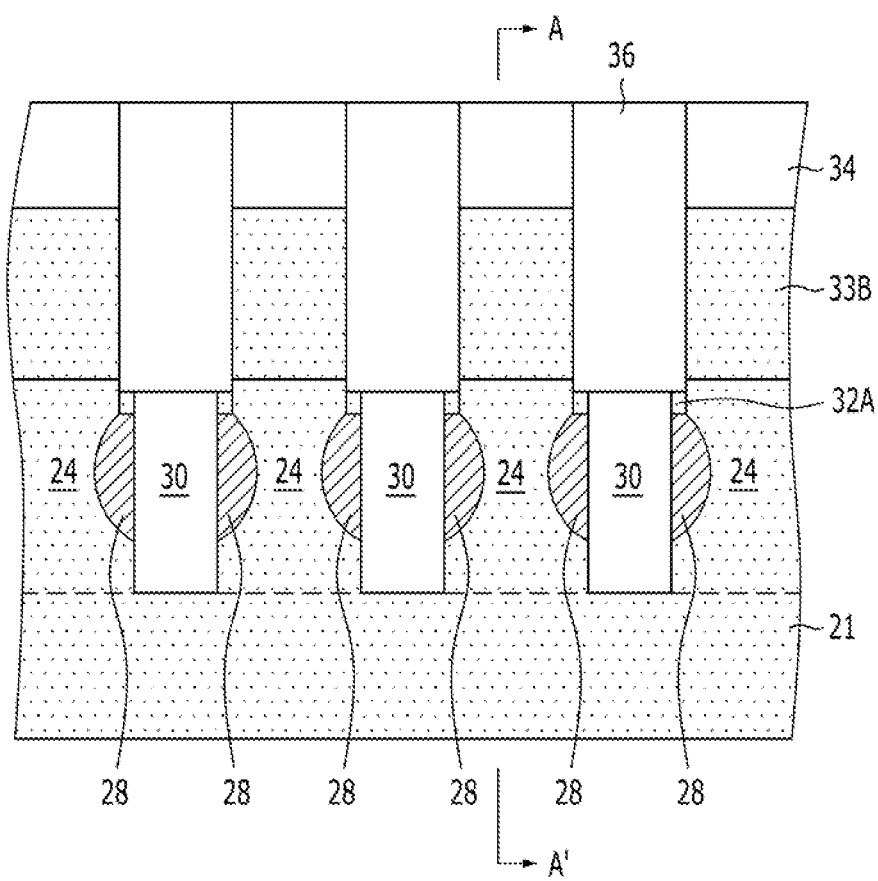

Referring to FIG. 4F, a second interlayer dielectric layer 35 is formed to fill the spaces between the preliminary semiconductor pillars 336 and the second hard mask patterns 34. The second interlayer dielectric layer 36 may be subsequently planarized.

Figure 5A:
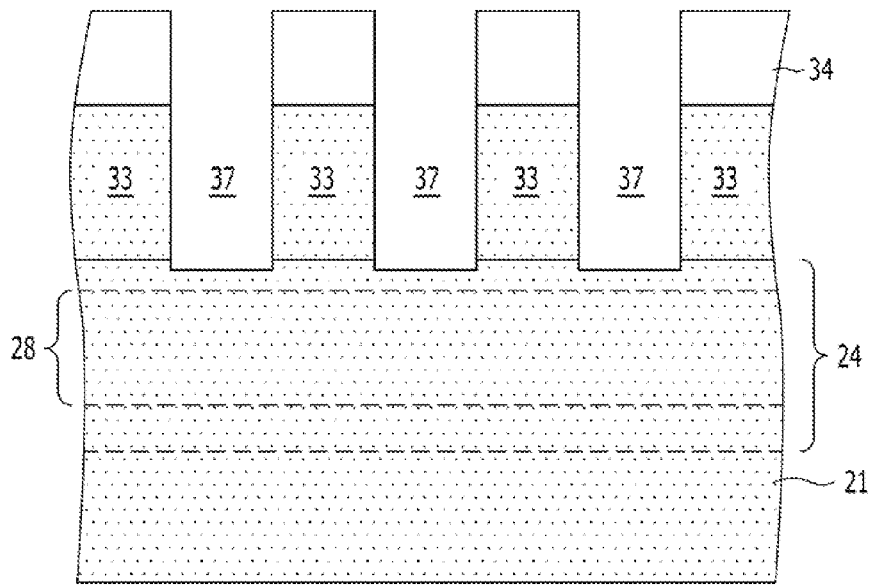
FIGS. 5A to 5C are cross-sectional views illustrating an exemplary method of forming the word lines of the semiconductor device in accordance with the first embodiment of the present invention.
Figure 5B:
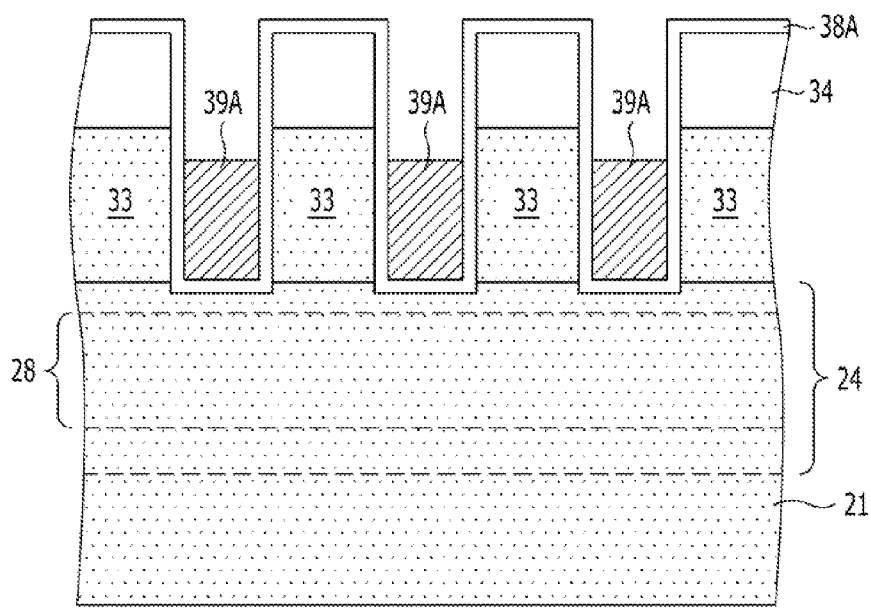
Figure 5C:
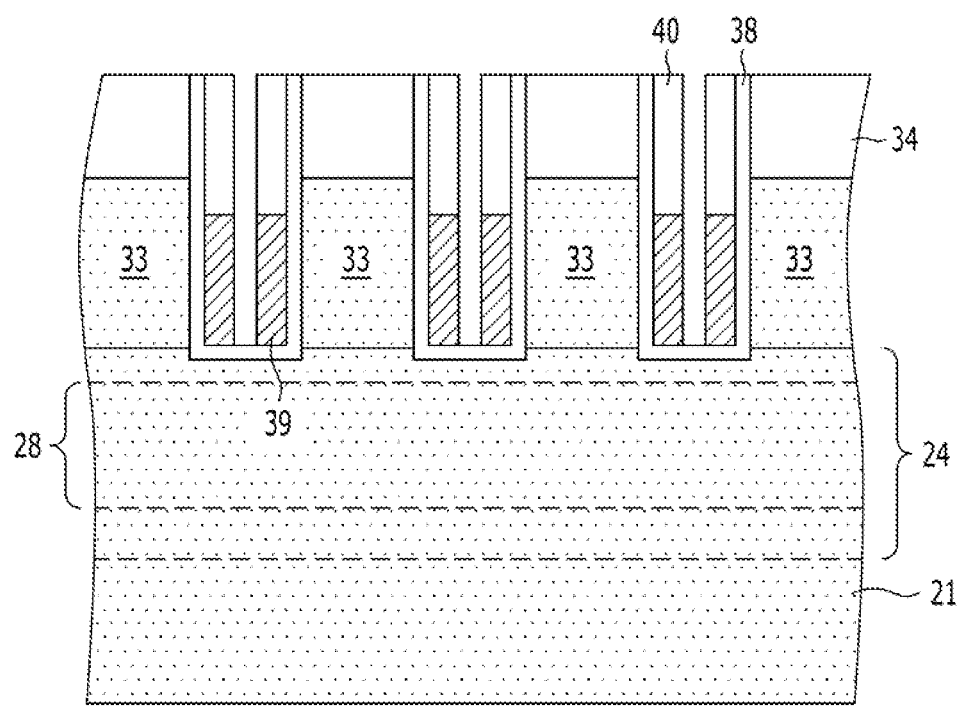

FIGS. 5A to 5C are cross-sectional views taken along the line A-A' of FIG. 4F, illustrating an exemplary method of forming the word lines of the semiconductor device in accordance with the first embodiment of the present invention.

Referring to FIG. 5A, by etching the preliminary semiconductor pillars 33B, a plurality of semiconductor pillars 33 are formed. The semiconductor pillars 33 may be separated from one another by third trenches 37. To define the third trenches 37, unillustrated photoresist patterns are used. The second hard mask layer patterns 34 are etched by using the photoresist patterns as an etch barrier. Subsequently, the preliminary semiconductor pillars 33B are etched. While not shown, the second interlayer dielectric layer 36 (see FIG. 4F) may be etched.

By etching the semiconductor pillars 33B in this way, the semiconductor pillars 33 are formed on the semiconductor body lines 24. In the semiconductor body lines 24, the buried bit lines 28 are buried, and the semiconductor pillars 33 are disposed perpendicular to the semiconductor body lines 24. In other words, vertical structures, where the buried bit lines 28 are positioned below the semiconductor pillars 33, are formed. The semiconductor body lines 24 and the semiconductor pillars 33 serve as active regions. The semiconductor body lines 24 are isolated from one another by the first interlayer dielectric layer 30 (see FIG. 4F), and have line shapes that extend in the same direction as the buried bit lines 28. The semiconductor pillars 33 are pillars which extend perpendicularly to the semiconductor body lines 24. The semiconductor pillars 33 are formed by a unit cell. Accordingly, a plurality of semiconductor pillars 33 are formed on one semiconductor body line 24 and are separated from one another by the third trenches 37. The third trenches 37 may have a depth that does not expose the buried bit lines 28.

The semiconductor pillars 33 have structures in which the source/drain regions and channel regions of vertical channel transistors are formed. A plurality of semiconductor pillars 33 may have a matrix type array on the semiconductor body lines 24. The semiconductor pillars 33 may include silicon pillars. For example, the semiconductor pillars 33 may include monocrystalline silicon pillars.

Referring to FIG. 5B, a third conductive layer 39A is formed to partially fill the third trenches 37. Before forming the third conductive layer 39A, a gate dielectric layer 38A may be formed. The gate dielectric layer 38A may be formed by oxidating the sidewalls of the semiconductor pillars 33 and the upper surfaces the semiconductor body lines 24. The third conductive layer 39A is formed by using a low resistance substance. For example, a metallic layer may be used. The metallic layer may include a titanium layer, a titanium nitride layer, a tungsten layer, or the like. The third conductive layer 39A may be recessed by sequentially performing planarization and etch-back.

Referring to FIG. 5C, by performing etch-back after depositing a dielectric layer, spacers 40 are formed. The spacers 40 may include a nitride layer.

The second conductive layer 39A is etched by using the spacers 40 as an etch barrier. Accordingly, word lines 39 are formed on both sidewalls of the semiconductor pillars 33. The word lines 39 may be formed in the second direction, which is the direction crossing the buried bit lines 28. The word lines 39 also serve as vertical gate electrodes. In another embodiment, the word lines 39 may be formed to surround the semiconductor pillars 33. In another exemplary embodiment, after forming annular vertical gate electrodes to surround the semiconductor pillars 33, the word lines 39 may connect the vertical gate electrodes. In a different exemplary embodiment, after forming vertical gate electrodes, the word lines 39 may be formed over the semiconductor pillars 33 to be connected through gate contacts.

While not shown, after forming storage node contact plugs (SNC), which are subsequently connected with the semiconductor pillars 33, capacitors may be formed over the storage node contact plugs. The capacitors include storage nodes. The storage nodes may have cylinder-like shapes. In another embodiment, the storage nodes may have a shape similar to a pillar or concave shapes. While not shown, a dielectric layer and top electrodes are formed subsequently.

The semiconductor device in accordance with the embodiments of the present invention may be included in a memory cell and a memory cell array. A bit line and a word line may store or output data based on the voltages applied by a column decoder and a row decoder, which are connected with the memory cell array.

The memory cell array according to the embodiments of the present invention may be included in a memory device. The memory device may include a memory cell array, a row decoder, a column decoder, a sense amplifier, and so forth. The row decoder selects a word line corresponding to a memory cell for which a read operation or a write operation is to be performed, among the word lines of the memory cell array, and outputs a word line select signal to the semiconductor memory cell array. Furthermore, the column decoder selects a bit line corresponding to a memory cell for which a read operation or a write operation is to be performed, among the bit lines of the memory cell array, and outputs a bit line select signal to the memory cell array. In addition, the sense amplifier senses the data stored in a memory cell selected by the row decoder and the column decoder.

The memory device in accordance with the embodiments of the present invention may be applied to a dynamic random access memory (DRAM), a static random access memory (SRAM), a flash memory, a ferroelectric random access memory (FeRAM), a magnetic random access memory (MRAM), a phase change random access memory (PRAM), etc.

The main product groups of the memory device described above may include computing memories used in a desktop computer, a laptop computer, a server, graphics memories with various specifications, and mobile memories, which are gaining popularities with the development of mobile communication. Also, the semiconductor device may be provided not only to portable storage media, such as a memory stick, an MMC, an SD, a CF, an xD picture card and a USB flash device, but also to various digital applications such as an MP3P, a PMP, a digital camera, a camcorder and a mobile phone. In addition, the semiconductor device may be applied not only to a single product of a semiconductor device but also to a multi-chip package (MCP), a disk on chip (DOC) and an embedded device. Moreover, the semiconductor device may be applied to a CMOS image sensor (CIS) to be supplied to various fields such as of a camera phone, a web camera, and a small-sized medical photographing device.

The memory device according to the embodiments of the present invention may be used in a memory module. The memory module includes a plurality of memory devices mounted to a module substrate, a command link enabling the memory devices to receive control signals (an address signal, a command signal and a clock signal) from an external controller, and a data link that is connected with the memory devices to transmit data. Herein, the command link and the data link may be formed in a manner identical or similar to those used in conventional semiconductor modules. In the memory module, eight memory devices may be mounted to the front side of the module substrate, and memory devices may also be mounted to the back side of the module substrate in the same manner. In other words, memory devices may be mounted to one side or both sides of the module substrate, and the number of the memory devices to be mounted is not limited. In addition, the material and the structure of the module substrate are not specifically limited.

The memory module according to the embodiments of the present invention may be used in a memory system. The memory system includes a controller that provides a bidirectional interface between at least one memory module having a plurality of memory devices mounted thereto and an external system to control the operation of the memory module.

The memory system according to the embodiments of the present invention may be used in an electronic apparatus. The electronic apparatus includes a memory system and a processor, which is electrically connected with the memory system. The processor includes a central processing unit (CPU), a microprocessor unit (MPU), a micro controller unit (MCU), a graphic processing unit (GPU) and a digital signal processor (DSP). The CPU or the MPU is configured by combining an arithmetic logic unit (ALU) as an arithmetic and logic operation unit and a control unit (CU) that reads and analyzes commands to control respective units. In the case where the processor is the CPU or MPU, the electronic apparatus may include a computer device or a mobile terminal. Also, the GPU is a CPU for a graphic, which is used to calculate numbers having decimal points, and serves as a processor to draw graphics on a screen in real time. In the case where the processor is the GPU, the electronic unit apparatus may include a graphic device. Also, the DSP refers to a processor that converts an analog signal (e.g., voice) into a digital signal or converts a digital signal to an analog signal at a high speed. The DSP mainly calculates digital values. In the case where the processor is the DSP, the electronic apparatus may include sound and image devices. In addition, the processor may include an accelerate processor unit (APU), which is configured by incorporating a CPU into a GPU and serves as a graphic card.

As is apparent from the above descriptions, according to the embodiments of the present invention, semiconductor pillars may be formed of high quality monocrystalline silicon without a defect, and thus, the reliability of a semiconductor device may be improved.

Also, according to the embodiments of the present invention, etching processes for forming semiconductor body lines, where buried bit lines are buried, and for forming the semiconductor pillars, where the vertical channels are subsequently formed, are separately performed, and thus, it may be possible to prevent leaning of the semiconductor body lines and the semiconductor pillars.

Furthermore, according to the embodiments of the present invention, the buried bit lines are not buried in trenches between the semiconductor pillars but formed below the semiconductor pillars, whereby the degree of integration may be increased, and the parasitic capacitance between adjacent buried bit lines may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of semiconductor body lines in which a plurality of buried bit lines are buried, to be separated by a plurality of trenches;
   forming a filling layer that fills each of the plurality of trenches;
   forming a conductive layer over the plurality of semiconductor body lines and the filling layer; and
   forming a plurality of semiconductor pillars over the plurality of semiconductor body lines by etching the conductive layer,
   wherein the filling layer is formed by flowing upper portions of the plurality of semiconductor body lines through a thermal process.

2. The method according to claim 1, wherein the plurality of semiconductor body lines, the filling layer and the plurality of semiconductor pillars comprise monocrystalline silicon.

3. The method according to claim 1, wherein the forming of the plurality of semiconductor body lines in which the plurality of buried bit lines are buried comprises:
   etching a semiconductor substrate to form the plurality of semiconductor body lines that are separated by a plurality of bulb-shaped trenches;
   forming a plurality of preliminary bit lines that partially fill the plurality of bulb-shaped trenches; and
   etching to partially remove portions of the plurality of preliminary bit lines and forming the plurality of buried bit lines that fill sidewalls of bulbs of the plurality of bulb-shaped trenches.

4. The method according to claim 3, wherein the forming of the plurality of semiconductor body lines that are separated by the bulb-shaped trenches comprises:
   etching the semiconductor substrate to form the plurality of preliminary semiconductor body lines that are separated by a plurality of preliminary trenches;
   forming a plurality of sacrificial layer patterns that partially fill the plurality of preliminary trenches;
   forming a plurality of spacers on upper sidewalls of the plurality of preliminary trenches;
   removing the plurality of sacrificial layer patterns; and
   etching the preliminary trenches by using the plurality of spacers as an etch barrier and forming the bulb-shaped trenches.

5. The method according to claim 1, further comprising:
   forming a dielectric layer that partially fills the trenches before the forming of the filling layer.

6. The method according to claim 1, wherein the conductive layer is formed through epitaxial growth by using the plurality of semiconductor body lines and the filling layer as seeds.

7. The method according to claim 1, wherein the forming of the plurality of the semiconductor pillars comprises:
   forming a plurality of line-type preliminary semiconductor pillars by etching a conductive layer;
   forming an interlayer dielectric layer that fills spaces between the plurality of preliminary semiconductor pillars; and
   forming the plurality of semiconductor pillars by etching the interlayer dielectric layer and the plurality of preliminary semiconductor pillars.

8. A method for fabricating a semiconductor device, comprising:
   etching a silicon substrate and forming a plurality of silicon body lines that are separated by a plurality of trenches;
   forming a dielectric layer in the trenches to have a height lower than a height of the plurality of silicon body lines;
   forming a filling silicon layer over the dielectric layer through a thermal process that allows silicon migration of the silicon body lines;
   forming a silicon layer over the filling silicon layer and the plurality of silicon body lines; and
   forming a plurality of silicon pillars over the plurality of silicon body lines by etching the silicon layer and the filling silicon layer, wherein the plurality of silicon pillars include channel regions of vertical channel transistors.

9. The method according to claim 8, wherein the plurality of silicon body lines and the filling silicon layer comprise monocrystalline silicon.

10. The method according to claim 8, wherein the filling silicon layer is formed through annealing under an atmosphere containing hydrogen.

11. The method according to claim 10, wherein the annealing is performed by using a mixture of hydrogen and an inert gas.

12. The method according to claim 8, further comprising:
cleaning the surfaces of the plurality of silicon body lines before the forming of the filling silicon layer.

13. The method according to claim 8, wherein the silicon layer is formed through epitaxial growth.

14. The method according to claim 8, wherein the forming of the plurality of silicon pillars comprises:
forming a plurality of line-type preliminary silicon pillars by etching the silicon layer;
forming an interlayer dielectric layer that fills spaces between the plurality of preliminary silicon pillars; and
forming the plurality of silicon pillars by etching the interlayer dielectric layer and the plurality of preliminary silicon pillars.

15. The method according to claim 8,
wherein the plurality of trenches comprise bulb-shaped trenches, and
wherein the method further comprises:
forming a plurality of preliminary bit lines that fill the bulb-shaped trenches after the forming of the plurality of silicon body lines; and
etching to partially remove portions of the plurality of preliminary bit lines and forming a plurality of bit lines that are buried in both sidewalls of the plurality of silicon body lines.

16. The method according to claim 8, further comprising:
forming plurality of word lines on sidewalls of the plurality of silicon pillars; and
forming capacitors to be connected with upper portions of the plurality of silicon pillars.

\* \* \* \* \*